United States Patent
Gemmink et al.

(10) Patent No.: US 6,309,781 B1
(45) Date of Patent: Oct. 30, 2001

(54) PHOTOMASK PROVIDED WITH AN ESD-PRECLUDING ENVELOPE

(75) Inventors: Jan W. Gemmink; Kees Van Hasselt, both of Nijmegen (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/460,934

(22) Filed: Dec. 14, 1999

(30) Foreign Application Priority Data

Dec. 14, 1998 (EP) .................................................... 98204236

(51) Int. Cl.$^7$ ................................. G03F 9/00; A47G 1/12
(52) U.S. Cl. .................................................... 430/5; 428/14
(58) Field of Search .................................. 430/5; 428/14; 206/316.1

(56) References Cited

U.S. PATENT DOCUMENTS 5,577,610   11/1996   Okuda et al. ........................ 206/454
5,691,088 * 11/1997   Kubota et al. ............................ 430/5

FOREIGN PATENT DOCUMENTS 5760335A    4/1982   (JP) .
05188583    7/1993   (JP) .

* cited by examiner

*Primary Examiner*—S. Rosasco
(74) *Attorney, Agent, or Firm*—Steven R. Biren

(57) ABSTRACT

A photomask (1) comprises a transmissive base plate (2), a first side of which is provided with a layer of a metallic mask material (4). In this layer, a mask pattern (6) is formed which is enclosed in an outer region (5) of mask material. The photomask is encapsulated in a protection layer (9) of transmissive and conductive material, which, on the first side of the base plate, is formed at such a distance from said first side that said protection layer remains free of the mask pattern.

The photomask is thus protected against electrostatic discharges which could damage the mask pattern, and the projection of the mask pattern is not adversely affected.

6 Claims, 1 Drawing Sheet

PHOTOMASK PROVIDED WITH AN ESD-PRECLUDING ENVELOPE

BACKGROUND OF THE INVENTION

The invention relates to a photomask comprising a base plate of a radiation-transmitting and electrically insulating material, a first side of which is provided with a layer of an electroconductive mask material wherein, inside a closed edge of that material, a mask pattern to be imaged is formed, the photomask being entirely enveloped in a protective layer of a radiation-transmitting, electroconductive material.

Such a photomask can particularly suitably be used in the manufacture of semiconductor devices and flat panel displays. In practice, the base plate generally is a plate of quartz glass, the layer of mask material generally contains chromium. The pattern of the mask is imaged, often on a reduced scale, on a layer of a photoresist which is provided, for example, on a layer of a metal. After exposure and development of the photoresist, the layer of metal can be etched in a pattern of conductor tracks corresponding to the mask pattern. The photomask pattern to be imaged comprises many closely spaced tracks of a mask material which are sometimes connected to larger areas of a mask material. The tracks correspond to the conductor tracks to be formed in the layer of metal, and the areas correspond to, for example, bond pads to be formed in the metal layer, which bond pads are used for contacting the devices to be manufactured.

The photomask is entirely enveloped in a protective layer of radiation-transmitting, electroconductive material. As a result, the mask pattern is incorporated in a Faraday cage which protects it against damage that might be caused by electrostatic discharges (Electro-Static-Discharge) in the mask pattern. When use is made of a photomask which does not have such a protective layer, in practice, the mask material present on the electrically insulating base plate may become electrically charged. This may be caused, for example, by air flowing past or by friction brought about by contact with clothing and other insulating materials. In order to be able to image the photomask onto the layer of photoresist, said photomask is placed in a projection apparatus on a grounded mask holder. In this manner, the closed edge of mask material present around the mask pattern is grounded. Voltage differences between this edge and the mask pattern may then develop, the magnitude of which is such that electric discharges occur in the mask pattern, which lead to said damage.

In JP-A-57-60335 a description is given of a photomask of the type mentioned in the opening paragraph, wherein the protective layer of radiation-transmitting, electroconductive material, in which the mask is enveloped, is a layer of indium oxide. The protective layer is deposited on the mask pattern on the first side of the mask and is situated on and between tracks of mask material.

The protective layer, which is deposited from the vapor phase, exhibits a homogeneous thickness. On the edges of the tracks of mask material extending transversely to the base plate, the thickness of the protective layer is substantially the same as on and between the mask tracks. Viewed transversely to the base plate, however, the thickness of the protective layer right next to the mask tracks is larger than centrally between the mask tracks. Consequently, right next to the mask tracks, radiation going through the mask during the projection of the mask pattern onto the layer of photoresist, passes through a much thicker layer than centrally between the mask tracks. Since such a layer has a refractive index which differs from that of air, diffraction phenomena will occur when the photomask is imaged. This may cause errors upon imaging the mask tracks onto the layer of photoresist.

SUMMARY OF THE INVENTION

It is an object of the invention to provide, inter alia, a mask having an ESD-precluding envelope which does not adversely affect imaging of the photomask onto a layer of a photoresist.

To achieve this, the photomask in accordance with the invention is characterized in that the protective layer is provided in a substantially homogeneous thickness on the first side of the base plate, at such a distance from said base plate that the protective layer remains free of the mask pattern to be imaged.

In this case, viewed transversely to the base plate, the protective layer has the same, practically homogeneous thickness right next to the mask tracks and centrally between the mask tracks. In this manner, the occurrence of diffraction phenomena, which may occur when use is made of the known photomask, is precluded. When the photomask is projected onto the layer of photoresist, the plane wherein the mask pattern is situated is sharply imaged, while the protective layer situated outside this plane is not. During imaging, the mask pattern is in focus, the protective layer is not. For this reason, small differences in thickness of the protective layer, which may still be present, do not influence the imaging operation.

In a first embodiment of the photomask, the protective layer is fixed, on the first side of the base plate, onto a ring which is provided on the edge of mask material and which encloses the pattern to be imaged. It is thus readily achieved that the protective layer is arranged at a distance from the base plate such that this protective layer remains free of the mask pattern to be imaged.

In a second embodiment of the photomask, the protective layer fixed on the ring is supported by a radiation-transmitting foil fixed on the ring. In this case, the protective layer does not have to be a continuous layer. Small openings, so-called pinholes, in the protective layer do not render the protection against electrostatic discharges less effective.

In practice it has been found that by using a protective layer of polyacetylene, damage to the mask pattern by electrostatic discharges is effectively precluded.

These and other aspects of the invention will be apparent from and elucidated with reference to the embodiment(s) described hereinafter.

BRIEF DESCRIPTION OF THE DRAWING

In the drawings.

The Figures are diagrammatic and not drawn to scale. Corresponding parts of the photomasks shown in the Figures are referred to by the same reference numerals.

DESCRIPTION OF THE PREFERRED EMBODIMENT

Figure 1:
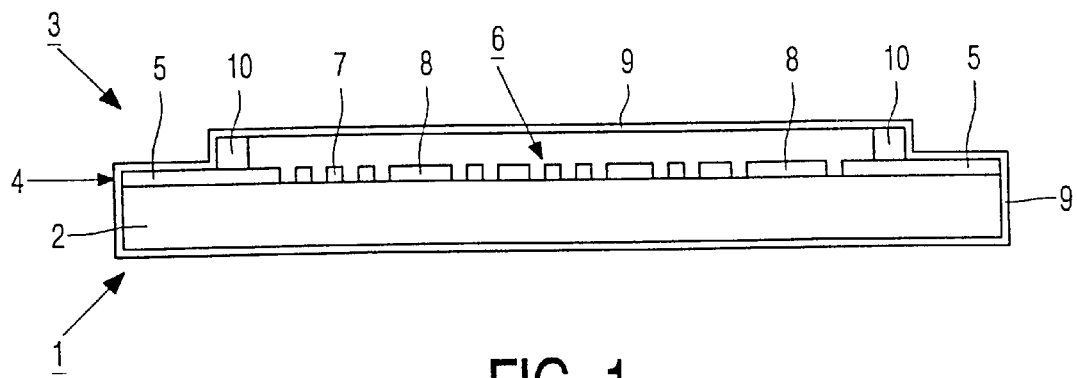
FIG. 1 is a diagrammatic, cross-sectional view of a first example of a photomask in accordance with the invention.

FIG. 1 is a diagrammatic, cross-sectional view of a first embodiment of a photomask 1 comprising a base plate 2 of a radiation-transmitting and electrically insulating material, which in this example is an approximately 5 mm thick plate of quartz glass. A first side 3 of this base plate 2 is provided with a layer of an electroconductive mask material 4. In this example, said layer is a customary, approximately 100 nm thick layer of chromium whose surface is provided with an approximately 10 nm thick anti-reflecting layer of chromium oxide (not shown). In the layer of mask material 4, a mask pattern 6 to be imaged is formed within a closed edge 5 of said material.

When use is made of the mask 1, the mask pattern 6 is imaged, often on a reduced scale, onto a layer of a photoresist which is applied, for example, to a layer of metal. After exposure and development of the photoresist, the layer of metal can be etched in a pattern of conductor tracks corresponding to the mask pattern. The pattern of the photomask to be imaged comprises many closely spaced tracks of mask material 7 which are sometimes connected to larger areas of mask material 8.

The photomask 1 is entirely enveloped in a protective layer 9 of radiation-transmitting, electroconductive material. Thus, the mask pattern 6 is incorporated in a Faraday cage, which causes charging of the mask pattern 6 to be precluded. As a result, large voltage differences between parts 7, 8 of the mask pattern 6 and the edge of mask material 5 are precluded. The protective layer 9 protects the mask 1 against damage which may be caused by electrostatic discharges (Electro-Static-Discharge).

On the first side 3 of the base plate 2, the protective layer 9 is provided in a substantially homogeneous thickness, at a distance from the base plate 2 such that the protective layer 9 remains free of the mask pattern 6 to be imaged. Viewed transversely to the base plate, and during imaging the mask pattern 6 in the direction of the radiation passing through it, the protective layer 9 exhibits a constant thickness. By virtue thereof, the occurrence of diffraction phenomena is avoided. When the photomask is projected, the mask pattern 6 is sharply imaged onto a layer of a photoresist, whereas the protective layer 9 situated outside the mask pattern 6 is not sharply imaged. As a result, small differences in thickness in the protective layer 9, which may still be present, do not influence the imaging operation.

In the first embodiment of the photomask 1, shown in FIG. 1, the protective layer 9 is fixed, on the first side 3 of the base plate 2, on a ring 10 which is provided on the edge of mask material and which encloses the mask pattern 6 to be imaged. In this example, the ring is an approximately 5 mm thick ring of stainless steel which is glued onto the edge 5 in a customary manner. The protective layer 9 can thus be readily provided at such a distance from the base plate 2 that this protective layer 9 remains free of the mask pattern 6 to be imaged.

Figure 2:
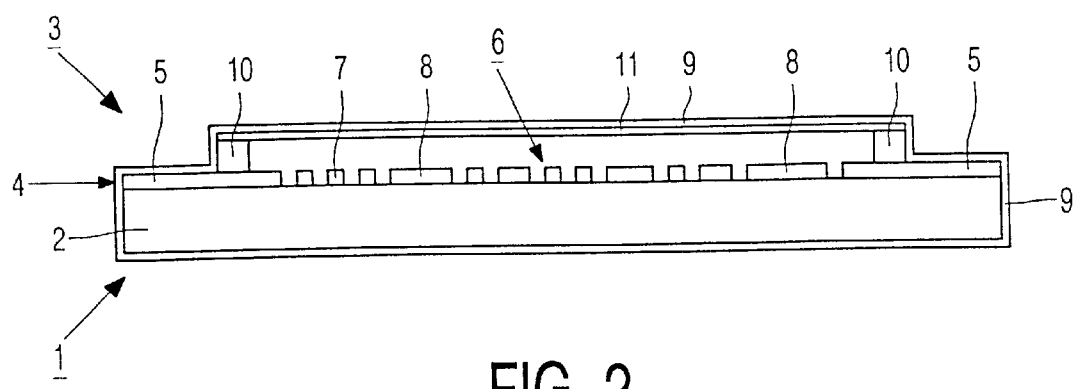
FIG. 2 is a diagrammatic, cross-sectional view of a second example of a photomask in accordance with the invention.

In the second embodiment of the photomask 1 shown in FIG. 2, the protective layer fixed on the ring 10 is supported by a radiation-transmitting foil 11 which is fixed on the ring 10. In this example, said foil is a customary nitrocellulose foil. In this case, the protective layer 9 does not have to form a continuous layer. Small openings, so-called pinholes, in the protective layer 9 do not render the protection against electrostatic discharges less effective.

In practice it has been found that by using a protective layer 9 of polyacetylene, damage to the mask pattern by electrostatic discharges no longer occurs.

What is claimed is:

1. A photomask comprising a base plate of a radiation-transmitting and electrically insulating material, a first side of which is provided with a layer of an electroconductive mask material wherein, inside a closed edge of that material, a mask pattern to be imaged is formed, the photomask being entirely enveloped in a protective layer of a radiation-transmitting, electroconductive material, characterized in that the protective layer is provided in a substantially homogeneous thickness on the first side of the base plate, at such a distance from said base plate that the protective layer remains free of the mask pattern to be imaged.

2. A photomask as claimed in claim 1, characterized in that the protective layer is fixed, on the first side of the base plate, onto a ring which is provided on the edge of mask material and which encloses the mask pattern.

3. A photomask as claimed in claim 2, characterized in that the protective layer fixed onto the ring is supported by a radiation-transmitting foil fixed onto the ring.

4. A photomask as claimed in claim 3, characterized in that the protective layer is a layer of polyacetylene.

5. A photomask as claimed in claim 3, wherein the radiation-transmitting foil is a nitrocellulose foil.

6. A photomask as claimed in claim 3, wherein the protective layer contains small openings.

\* \* \* \* \*